United States Patent [19]

Wong et al.

[11] Patent Number: 4,871,930

[45] Date of Patent: Oct. 3, 1989

[54] PROGRAMMABLE LOGIC DEVICE WITH ARRAY BLOCKS CONNECTED VIA PROGRAMMABLE INTERCONNECT

[75] Inventors: Sau-Ching Wong, Hillsborough; Hock-Chuen So, Milpitas; Stanley J. Kopec, Jr.; Robert F. Hartmann, both of San Jose, all of Calif.

[73] Assignee: Altera Corporation, Santa Clara, Calif.

[21] Appl. No.: 190,663

[22] Filed: May 5, 1988

[51] Int. Cl.[4] .......................................... H03K 19/177
[52] U.S. Cl. ..................................... 307/465; 307/578; 307/303
[58] Field of Search ................ 307/465, 303, 468–469; 364/716

[56] References Cited

U.S. PATENT DOCUMENTS

| | | | |
|---|---|---|---|
| 3,566,153 | 2/1971 | Spencer | 307/205 |
| 4,124,899 | 11/1978 | Birkner et al. | 364/716 |
| 4,525,641 | 6/1985 | Cruz et al. | 307/465 |
| 4,554,640 | 11/1985 | Wong et al. | 307/465 X |
| 4,609,986 | 9/1986 | Hartmann et al. | 364/200 |
| 4,617,479 | 10/1986 | Hartmann et al. | 307/465 |
| 4,664,191 | 2/1987 | Fisher et al. | 307/465 |
| 4,677,318 | 6/1987 | Veenstra | 307/465 |
| 4,689,654 | 8/1987 | Brockmann | 307/465 X |
| 4,703,206 | 10/1987 | Cavlan | 307/465 |
| 4,713,792 | 12/1987 | Hartmann et al. | 364/900 |
| 4,758,746 | 7/1988 | Birkner et al. | 307/465 |

OTHER PUBLICATIONS

J. C. Leininger, "Universal Logic Module," *IBM Technical Disclosure Bulletin*, vol. 13, No. 5, pp. 1294–1295, Oct. 1970.

E. Goetting et al., "A CMOS Electrically-Reprogrammable ASIC with Multi-Level Random Logic Capabilities," *1986 IEEE International Solid-State Circuits Conference*, pp. 244–245 and 359–360, 1986.

R. R. Munoz et al., "Automatic Partitioning of Programmable Logic Devices," *VLSI Systems Design*, Oct. 1987, pp. 74–76, 78, and 86.

*Primary Examiner*—David Hudspeth
*Attorney, Agent, or Firm*—Robert R. Jackson

[57] ABSTRACT

A programmable logic device having a relatively small number of programmable product terms ("P-terms") feeding each fixed combinatorial logic device, and additional "expander" programmable P-terms which do not directly feed a fixed device. Relatively simple logic functions can be performed by suitably programming the P-terms feeding the fixed devices. More complex logic functions can be performed by suitably programming the required number of expander P-terms, and then combining the outputs of those P-terms by means of another P-term. In addition a programmable interconnect array is provided to allow certain inputs to the device to be applied to any programmable portion of the device, and also to allow the outputs of at least one of the fixed devices to be also applied to any programmable portion of the device.

15 Claims, 14 Drawing Sheets

| P | C | D | CLK | Q |
|---|---|---|-----|---|
| 1 | 1 | 0 | ↑ | 0 |
| 1 | 1 | 1 | ↑ | 1 |
| 1 | 0 | X | X | 0 |
| 0 | 1 | X | X | 1 |
| 0 | 0 | X | 0 | $Q_0$ |
| 0 | 0 | 0 | 1 | 0 |
| 0 | 0 | 1 | 1 | 1 |

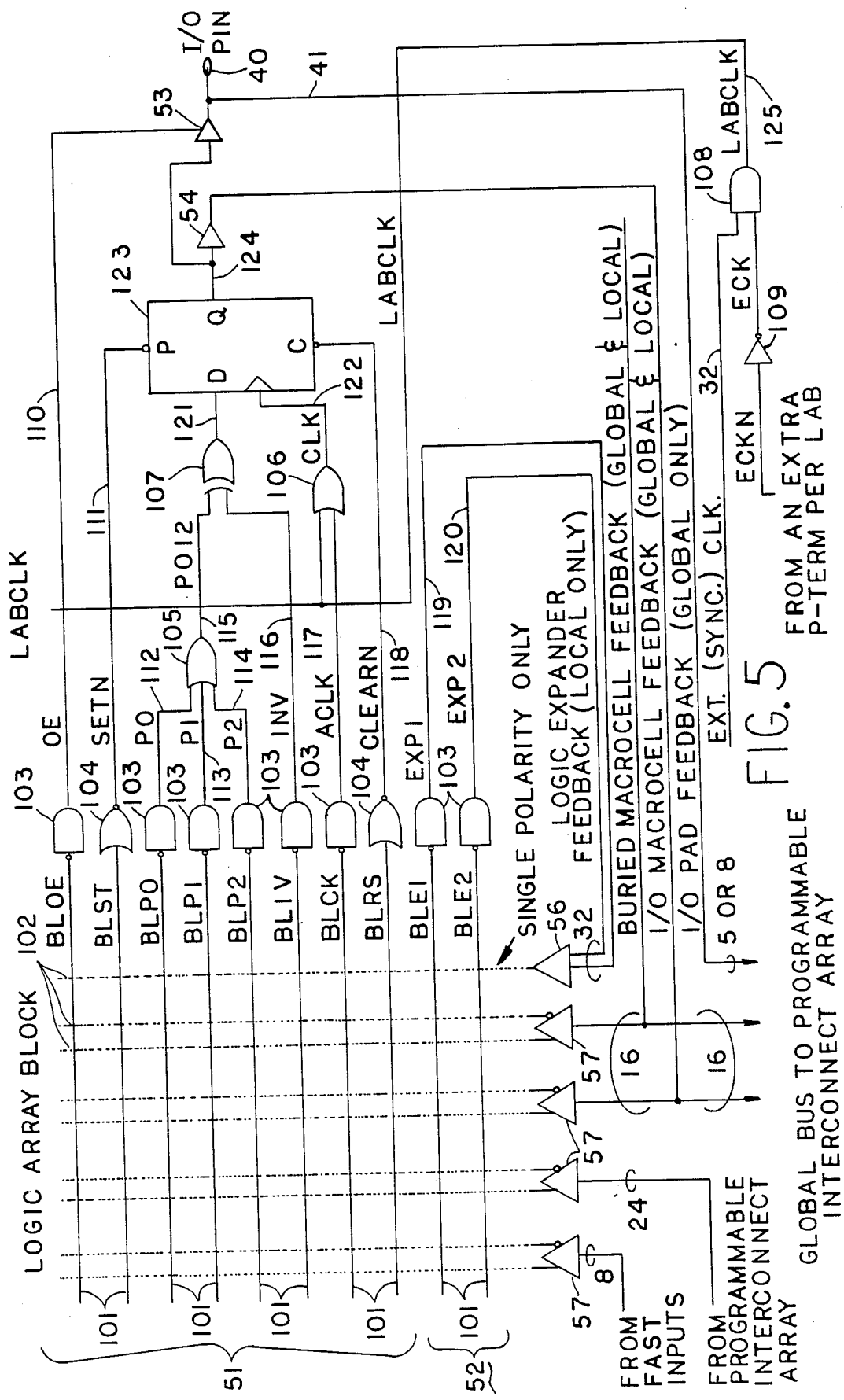

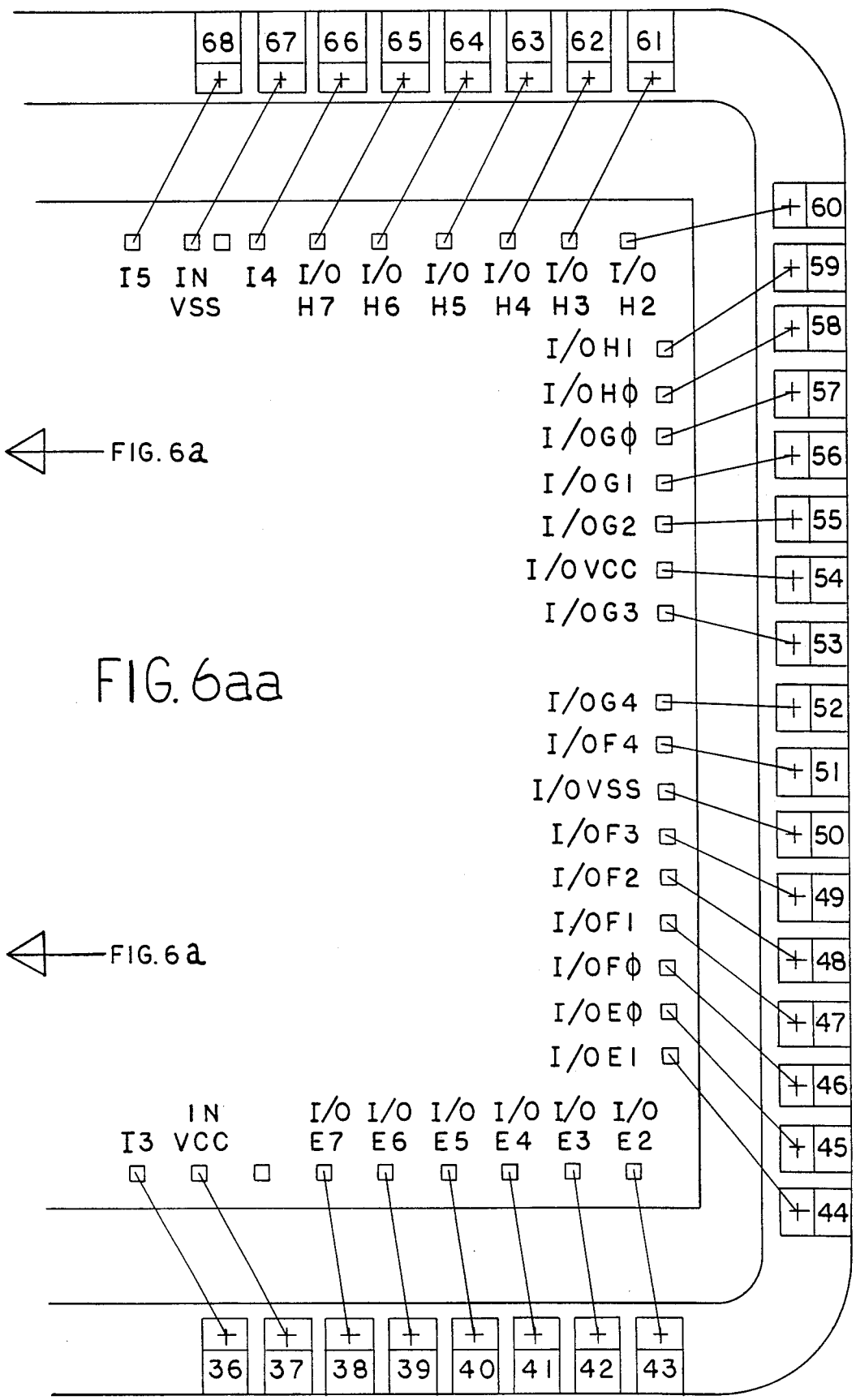

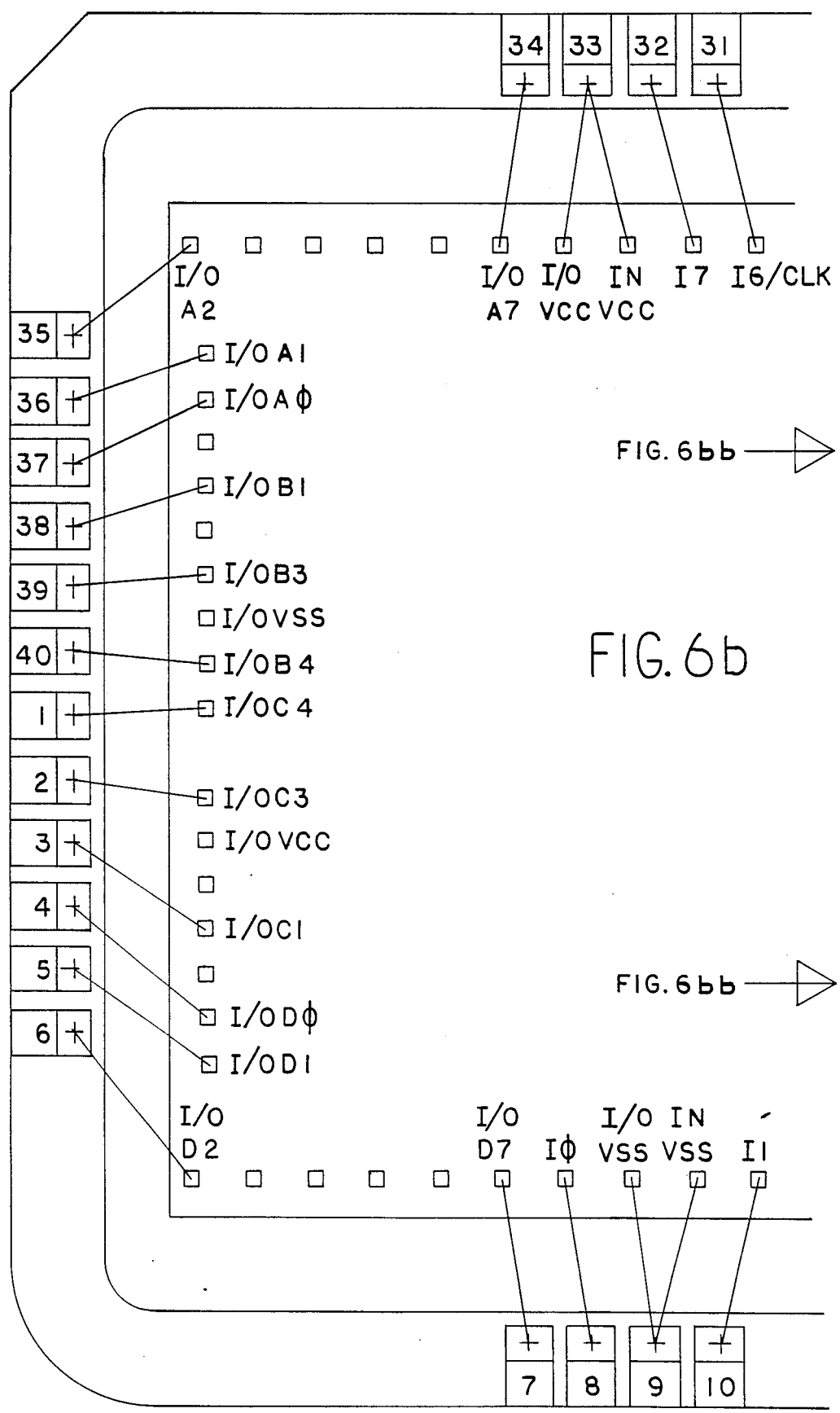

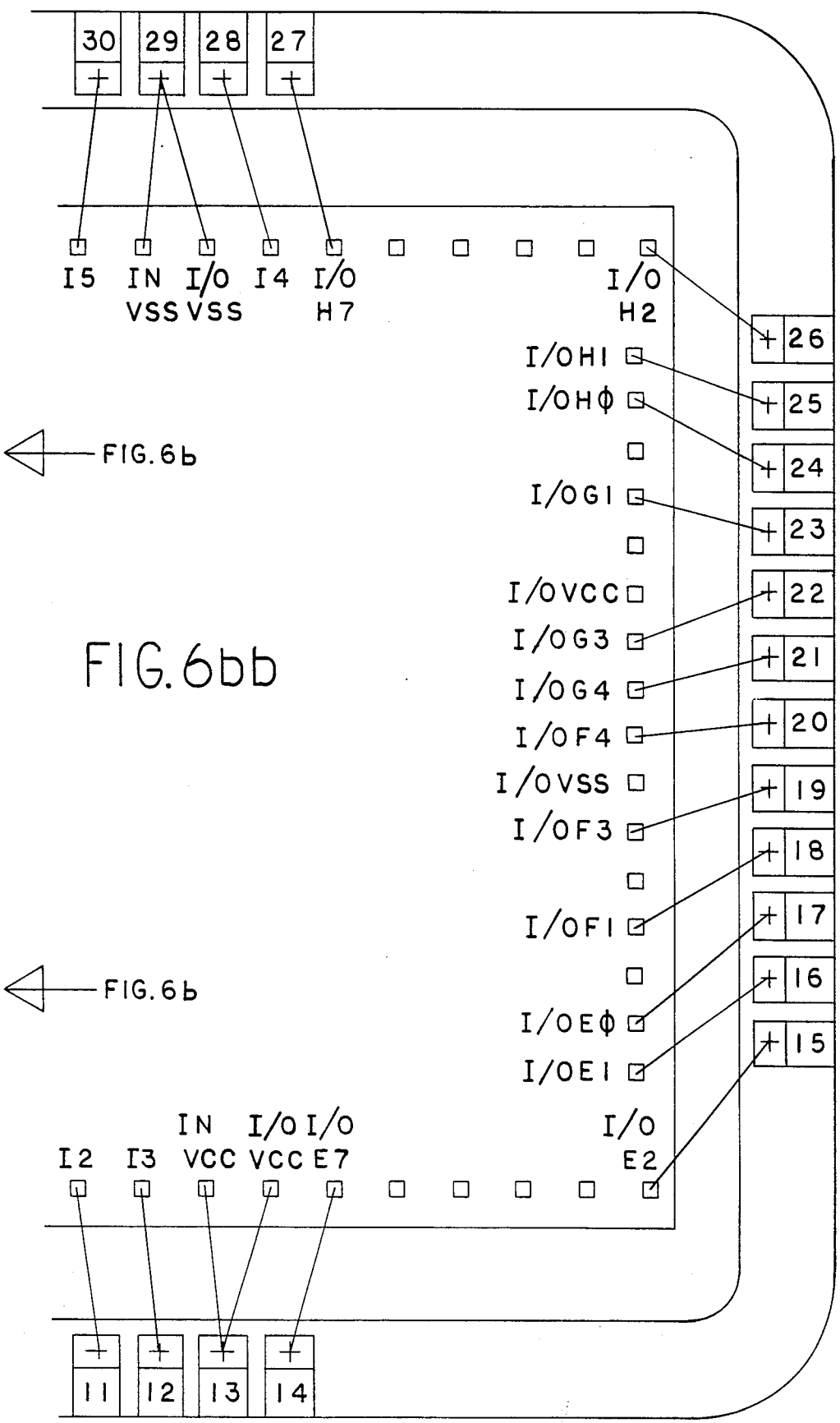

FACTORING OUT EXPANDERS

FITTING ON EXPANDERS

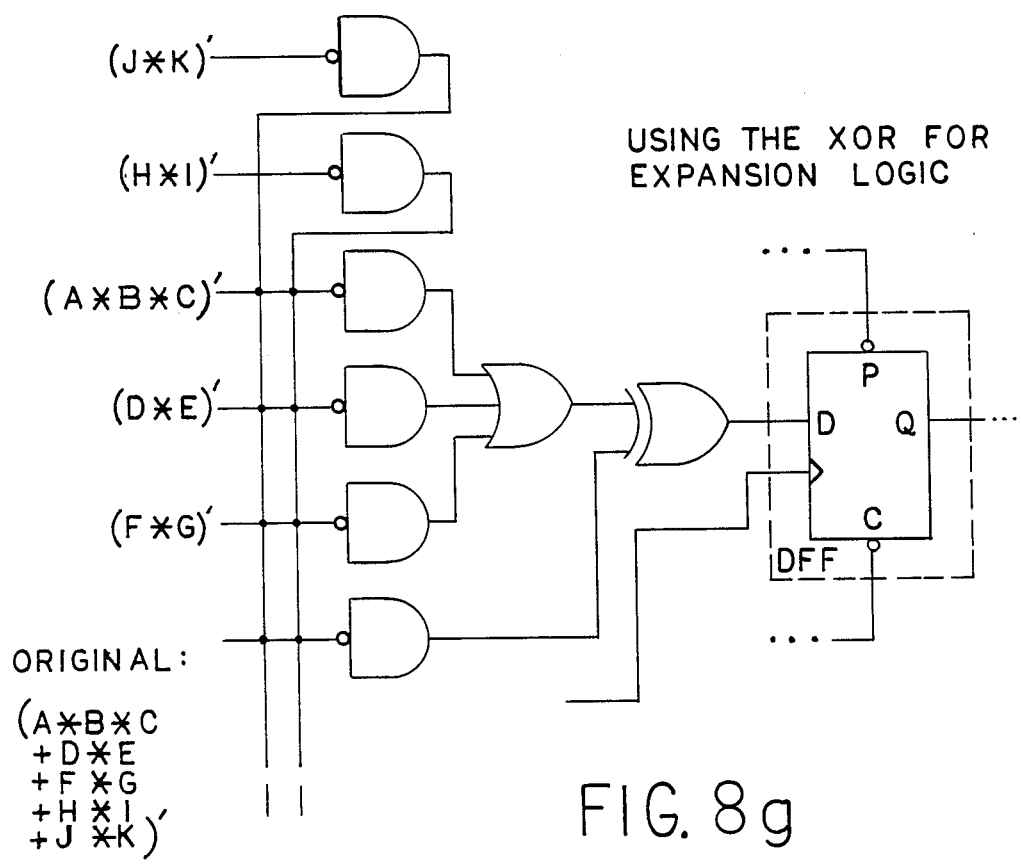
FIG. 8g
FIG. 8h
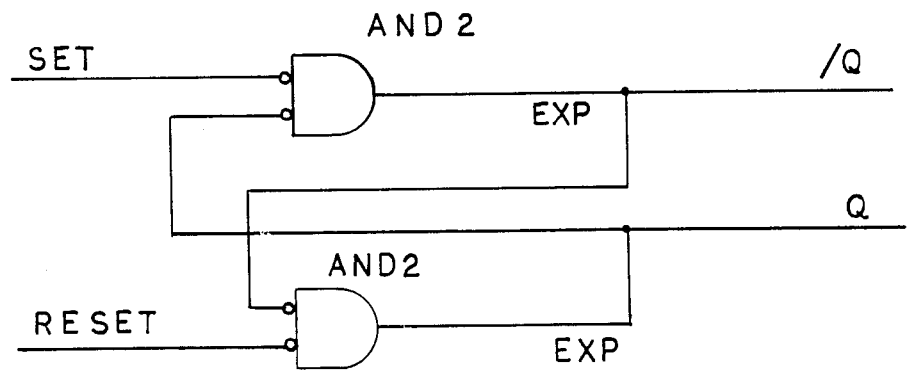

PROGRAMMABLE LOGIC DEVICE WITH ARRAY BLOCKS CONNECTED VIA PROGRAMMABLE INTERCONNECT

BACKGROUND OF THE INVENTION

This invention relates to programmable logic integrated circuits. In particular, the invention relates to a new architecture which provides for greater utility and flexibility of programmable logic devices ("PLDs"), and allows for programmable logic devices of much greater complexity than previously were possible.

The following references are background to this invention: Hartmann et al. U.S. Pat. Nos. 4,617,479; 4,609,986; Veenstra U.S. Pat. No. 4,677,318; Hartmann et al. U.S. Pat. No. 4,713,792; Birkner et al. U.S. Pat. No. 4,124,899; Cavlan U.S. Pat. No. 4,703,206; Spencer U.S. Pat. No. 3,566,153; J. C. Leininger, "Universal Logic Module", *IBM Technical Disclosure Bulletin*, Vol. 13, No. 5, October 1970, pp. 1294–95; Ronald R. Munoz and Charles E. Stroud, "Automatic Partitioning of Programmable Logic Devices", *VLSI Systems Design Magazine*, October 1987, pp. 74–78, and 86: and E. Goetting et al., "A CMOS Electrically-Reprogrammable ASIC with Muti-Level Random Logic Capabilities", 1986 *IEEE International Solid State Circuits Conference* (*Proceedings*), pp. 244, 245, 359, and 360. All of these references are hereby incorporated by reference herein.

Several approaches have been used for the architecture of programmable logic integrated circuits. Among these are the "programmable AND, fixed OR" structure (referred to as a PAL) used in the above-mentioned Birkner et a. patent. This architecture has the advantages of higher speed and a simpler structure. However, because it has a fixed number of "product terms" (hereinafter "P-terms") per OR logic function (eight P-terms is typical of most current PAL products), and because these P-terms cannot be shared by neighboring OR gates, many P-terms are typically wasted. On the other hand, there are occasions when eight P-terms are not enough to handle the more complex logic functions. Experience has shown that in a broad range of applications, eight P-terms is on average much more than enough, and yet it is also often insufficient. For example, FIG. 2 in the above-mentioned Munoz et al. article is a graph of P-term requirements for a relatively large sample of logic functions (Munoz et al. FIG. 2 is substantially reproduced herein as FIG. 1). Similar studies done by the assignee of the present invention arrive at roughly similar conclusions: namely, a large percentage of logical functions (on the order of 50 to 70 percent) require less than four P-terms. However, a relatively significant "tail" exists where eight P-terms is not enough.

One way to achieve higher P-term utilization is to provide "variable P-term distribution". In essence, this is an attempt to guess a mixture of P-term requirements such that some OR gates have few P-terms (e.g., four), and some have a relatively large number (e.g., 12 or 16). See, for example, above-mentioned U.S. Pat. No. 4,609,986. This partially solves the problem of P-term utilization, but it significantly increases the complexity of the software support task because each function must be examined and then, depending upon its demand for P-term resources, assigned to a specific macrocell which has the minimum resources needed to fulfill the required demand (this process is called "fitting"). However, even with variable P-term distribution, many P-terms are typically still wasted.

Another way in which this P-term allocation problem can be solved is suggested in the above-mentioned paper by Leininger. With this structure, the P-term array is viewed as an array of programmable NOR or NAND gates whose inputs are programmable. Functions which require more than a single P-term are broken into multi-level NAND (or NOR) functions. Each level of (e.g., NAND) logic takes one P-term. Using this type of array, even quite complex logic functions can be done in a few levels of NAND logic. Again, however, there are some drawbacks. First, it is very likely that most logic functions will take more than a single P-term. This means that most often, several passes through the array will be required, and this causes a slowing down of evaluation of the function. Second, each P-term must feed back into the array input section. Thus, as the number of P-terms grows, so does the number of input lines. Even for arrays of modest complexity, the number of input signal lines (sometimes called "word lines") becomes excessive. For example, the part described in the above-mentioned IEEE ISSCC paper has only eight macrocells but has nearly 100 word lines, while a PAL circuit of similar complexity has only half as many word lines. Each word line adds to the length (and therefore the parasitic capacitance) of all of the P-terms. Greater P-term length leads to slower signal propagation.

Finally, there are programmable logic arrays ("PLAs") of the type described in the above-mentioned Spencer patent. Most (if not all) functions can be accomplished in one pass through the "AND" array plus one pass through the "OR" array. However, even the simplest functions require these two array delays. Thus, compared to the PAL architecture, there is a speed penalty (at least for simple functions). This type of PLA circuit is also more complex to execute in silicon because of the need for interface buffering between the AND and the OR array, and because of the inherently more complex programming circuits needed to program the two arrays.

In prior art programmable logic devices, a major obstacle to increasing the logic density has been array sizes which increase as the "square" of the increase in the number of output functions. This is true because for complete generality, it is necessary that all output functions also feed back as inputs into the array. However, in practice, it has been observed that this is massive overkill. That is, on average, only some subset of functions needs to be fed back. One solution to this problem is to break a single large array into several smaller arrays with functional communication between the smaller array blocks. In prior art devices such as the EP1200 (see U.S. Pat. No. 4,609,986) and the EP1800 (both commercially available from Altera Corporation of Santa Clara, Calif.), this interconnect between blocks was done in a fixed manner. That is, in a device with several array blocks, there is local feedback to an array block, and there are a certain fixed number of global feedback signals between array blocks. While this approach does serve to keep the array sub-blocks to reasonable size (both from a bit density and a speed point of view), it creates routing bottlenecks between blocks. For example, in the Altera EP1800, there are four array blocks each with 12 flip-flop macrocells. Only four macrocell outputs from each array block are routed as global inputs to the other blocks. This bottleneck causes significant restrictions in allowing logic functions to "fit" within a device even though there are enough other resources (such as flip-flops, I/O pins, etc.).

In view of the foregoing, it is an object of this invention to provide an architecture for programmable logic devices which allows for the implementation of PLDs of much greater complexity.

It is another object of the invention to maximize the utilization of P-terms in PLDs.

It is a further object of the invention to make PLDs of high complexity that can operate at high speed.

It is a further object of the invention to provide for multiple logic array blocks ("LABs") which can operate independently or in concert, and to provide for a programmable interconnect array ("PIA") structure which allows for ease of communication between these array blocks.

It is a further object of the invention to provide a macrocell which is simpler and provides for increased functionality.

It is a further object of the invention to provide a regular, repeatable architecture which will be easy for a user to understand and easy for software tools to support.

It is a further object of the invention to provide for a modular architecture which allows for ease in constructing a family of products simply by reducing or increasing the number of LABs and the associated PIA structure.

It is a further object of the invention to allow for package bonding options such that some of the I/O pins are not bonded out, thus allowing high density PLDs to be put into relatively low pin-count packages.

SUMMARY OF THE INVENTION

The present invention solves all of the above-mentioned P-term allocation problems, and in addition provides a programmable interconnect array structure which allows the implementation of much larger programmable logic devices (PLDs) than have heretofore been possible. Among the major elements of the present invention are:

1. The logic array block ("LAB") best seen in FIG. 3.
2. The macrocell/flip-flop block best seen in FIG. 5.
3. The programmable interconnect array ("PIA") best seen in FIG. 3.
4. The input/output circuit best seen in FIG. 5.
5. The clock functions best seen in FIG. 5.

( A. The Logic Array Block (LAB)

As mentioned above, the present invention increases the utilization of P-terms. Most functions (e.g., counters, demultiplexers, 2-to-1 and 4-to-1 multiplexers, and shift registers, as well as any simple AND, OR, NAND, or NOR function) can be done in one pass through the array. Many more complex functions which require three P-terms or less and which can directly utilize the EXCLUSIVE-OR (XOR) gate can also be done directly in a single pass through the array. This accounts for approximately 70% of the logic functions that are found in most logic designs. The remaining functions which require additional product terms can be done by using "expander" P-terms which (in combination with the three-P-term programmable AND, fixed OR XOR) can produce very complex NAND-NAND, AND-OR, OR-AND, and NOR-NOR types of functions. The general advantage of this combined structure is that a majority of logic functions can be done in one pass through the array (thus achieving maximum speed), and even the most complex functions can be done in two passes.

B. The Macrocell/Flip-Flop Block

The output of the above-mentioned AND-OR-XOR structure feeds a flip-flop logic block. In prior art circuits such as the Altera EP300 (see U.S. Pat. No. 4,617,479) this is typically a conventional D flip-flop with a mechanism for allowing the flip-flop register to be optionally bypassed to allow the combinational output to be applied directly to the output section if desired. In the device described herein, this structure has been modified such that the multiplexer and attendant control formerly required to bypass the flip-flop are no longer necessary. In place of the old structure a new flip-flop structure has been incorporated which allows operation as a D flip-flop, a level-sensitive latch, or a completely flow-through device which allows combinatorial functions to be directly propagated. A preferred structure for this new flip-flop is described in concurrently filed, commonly assigned, co-pending U.S. patent application Ser. No. 190,530, which is hereby incorporated by reference herein.

C. Programmable Interconnect Array (PIA)

The device of this invention solves the routing bottleneck problem by the creation of a programmable interconnect array (PIA) which allows any logic function output and any of the I/O input signals to be input to any of the logic array blocks (LABs). With this programmable interconnect array structure in place, the LABs can be kept to sizes which are functionally convenient, modular, and have a reasonable number of programmable elements. While all logic function outputs and the I/O inputs are taken into the PIA (a total of 180 word lines in the case of the device depicted in FIG. 3), only a subset (24 in the case of the present devices) are programmably routed as inputs into each of the logic array blocks. Unless an LAB requires more than 24 such inputs (which is highly unlikely), this architecture allows for completely general routing of signals.

D. Input/Output

In most prior art programmable logic devices, certain package pins are designated as inputs and others as outputs (see, for example, the MMI 16R8, commercially available from Monolithic Memories Incorporated (now merged with and part of Advanced Micro Devices ("AMD") of Sunnyvale, Calif.). An improvement on this has been the use of tri-state buffers in conjunction with a feedback path from the I/O pin back into the array such that when the output buffer is in its tri-state condition, the pin may be used as an input (see the above-mentioned Birkner et al. patent. This mechanism provides for flexibility of usage of pin resources. However, when the I/O buffer is tri-stated and the associated pin is used as an input, the associated output macrocell logic is lost. This is a waste of precious resources. A solution to this problem is provision for "dual-feedback" such as that found on certain pins of the Altera EP1800. Dual feedback provides a feedback path both from the I/O pin and from its associated logic macrocell. Thus when the output buffer is tri-stated, the I/O pin can be used as an input and the macrocell resource can still be used as a "buried" register. In the present device, this mechanism is further improved in that I/O pin feedback does not go directly into the array, but rather is an input to the PIA. Thus I/O input lines can go to any or all of the LABs, while at the same time the logic macrocell function can be used (1) locally as feedback to its own LAB, and (2) globally via the PIA. Thus I/O pin functions are effectively decoupled from the logic arrays. This provides for much greater utility and flexibility than was heretofore possible.

E. Clock Functions

Generally the register functions in PLDs are clocked either synchronously (for example, see the MMI 16R8) or asynchronously (see the MMI 20RA10). In most systems, there is a need for both types of capabilities. A solution to this problem is the structure that has been used in the Altera EP600, EP900, and EP1800. In these devices a multiplexer has been provided which allows the user to select either the synchronous (global) clock signal or an "asynchronous" (local P-term) clock. This selection can be made on a macrocell-by-macrocell basis. However, this multiplexer structure adds to the complexity of the device, and the additional circuitry needed to make the selection adds delay to the clock signal. An improved approach has been taken in the present device which allows for a simple clock gating of the "global" synchronous clock with a local P-term. If the synchronous clock is desired, then the asynchronous clock P-terms are programmed such that they are always low. This allows the global clock signal to pass to the flip-flop. If asynchronous clocking is desired, the global clock signal is forced low (again by proqramming) and the local clock P-term is allowed through to clock the flip-flop. The clock selection (i.e., synchronous versus asynchronous) is done on a per LAB basis. This structure completely eliminates the clock multiplexer and the controls for same. This new structure is simpler and faster.

Further features of the invention, its nature and various advantages will be more apparent from the accompanying drawings and the following detailed description of the invention.

BRIEF DESCRIPTION OF THE DRAWINGS

FIG. 5 is a logical representation of a (macrocell) portion of an LAB in the embodiment of FIGS. 3 and 4.

FIGS. 8a through 8h illustrate the way in which logic functions of varying complexity can be fit into the macrocell of the present invention.

DETAILED DESCRIPTION OF THE PREFERRED EMBODIMENTS

Figure 3:
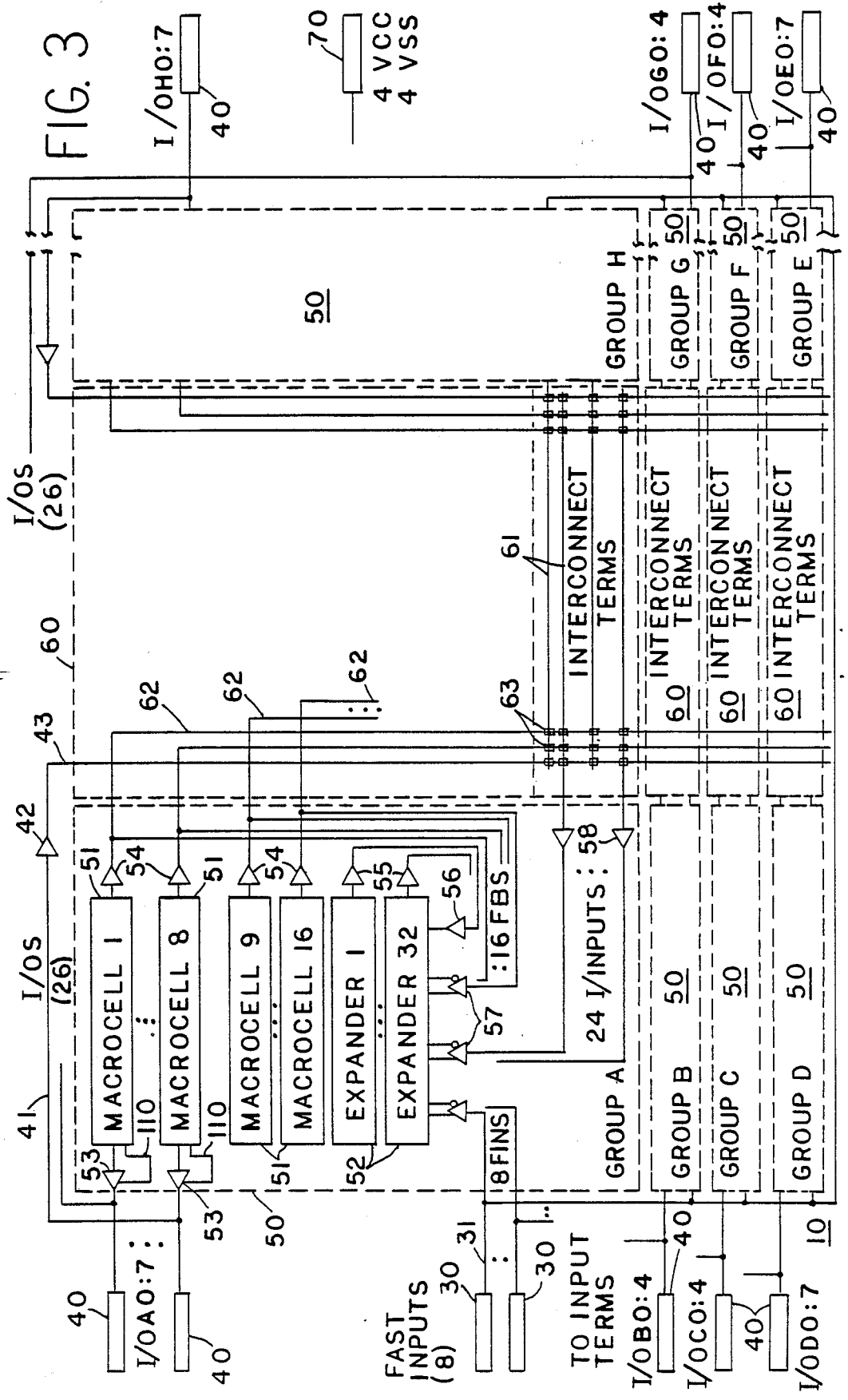
FIG. 3 is a block diagram of an illustrative embodiment of the present invention.

FIG. 3 is an overall block diagram of an illustrative embodiment of a programmable logic device 10 constructed in accordance with the present invention. The major elements shown in this diagram are "fast inputs" 30, I/O pads 40, logic array blocks (LABs) 50, and programmable interconnect array (PIA) blocks 60.

Input signals into chip 10 come from either fast inputs 30 or I/O inputs 40. Fast inputs 30 are routed via lines 31 to all of LABs 50. These signals drive into the array portion of the LAB through buffers 57 which provide both the true and complement polarity of the signal presented to the fast input pad. These lines are called fast inputs because they go directly to the LABs, in contrast to I/O inputs 40 which go indirectly to the LABs via PIA blocks 60. This can be seen by following representative signal line 41 from the pads labeled I/O0:7 (which represent eight such I/O pads) to buffer 42. After the signal has been suitably buffered by buffer 42, it drives into the PIA along line 43. By means of programmable elements 63 which are at the intersection of PIA word lines 43 and interconnect term lines 61, a signal which originated at one of the I/O pads 40 can be routed to any LAB 50 via the interconnect term 61 through buffer 58 and then into a true/complement LAB word line buffer 57. Signals propagating to an LAB via this path take additional time to traverse the PIA. Hence these signals are "slower" than the "fast" input lines 31 which go directly to the LAB as explained above. The reasons for providing these two different paths will be explained in due course.

A typical LAB 50 will now be explained in more detail. In this architecture there can be as many LABs as is deemed desirable. For example, in various preferred embodiments implemented to date we have used either four or eight LABs.

Each LAB 50 comprises macrocells 51 and expanders 52. Inputs to the LAB are provide by fast inputs via buffers 57, PIA inputs via interconnect terms 61 through buffers 58 and 57, feedback terms from macrocell outputs via buffers 54 and 57, and expander feedback terms via buffers 55 and 56. Two types of macrocells are provided. The only difference is the inclusion of output buffers 53 (plus their associated output enable (OE) signal 110 which provides the output tristate control) in macrocells 1 through 8. Output buffers 53 selectively apply the associated macrocell outputs to I/O signal pins 40. Macrocells 9 through 16 have no associated output buffer and are therefore sometimes referred to as "buried" macrocells. In either case, the macrocells all have buffers 54 which take the signal generated by the macrocell and feed it to its own LAB (as described above) and also drive PIA word lines 62.

Figure 7:
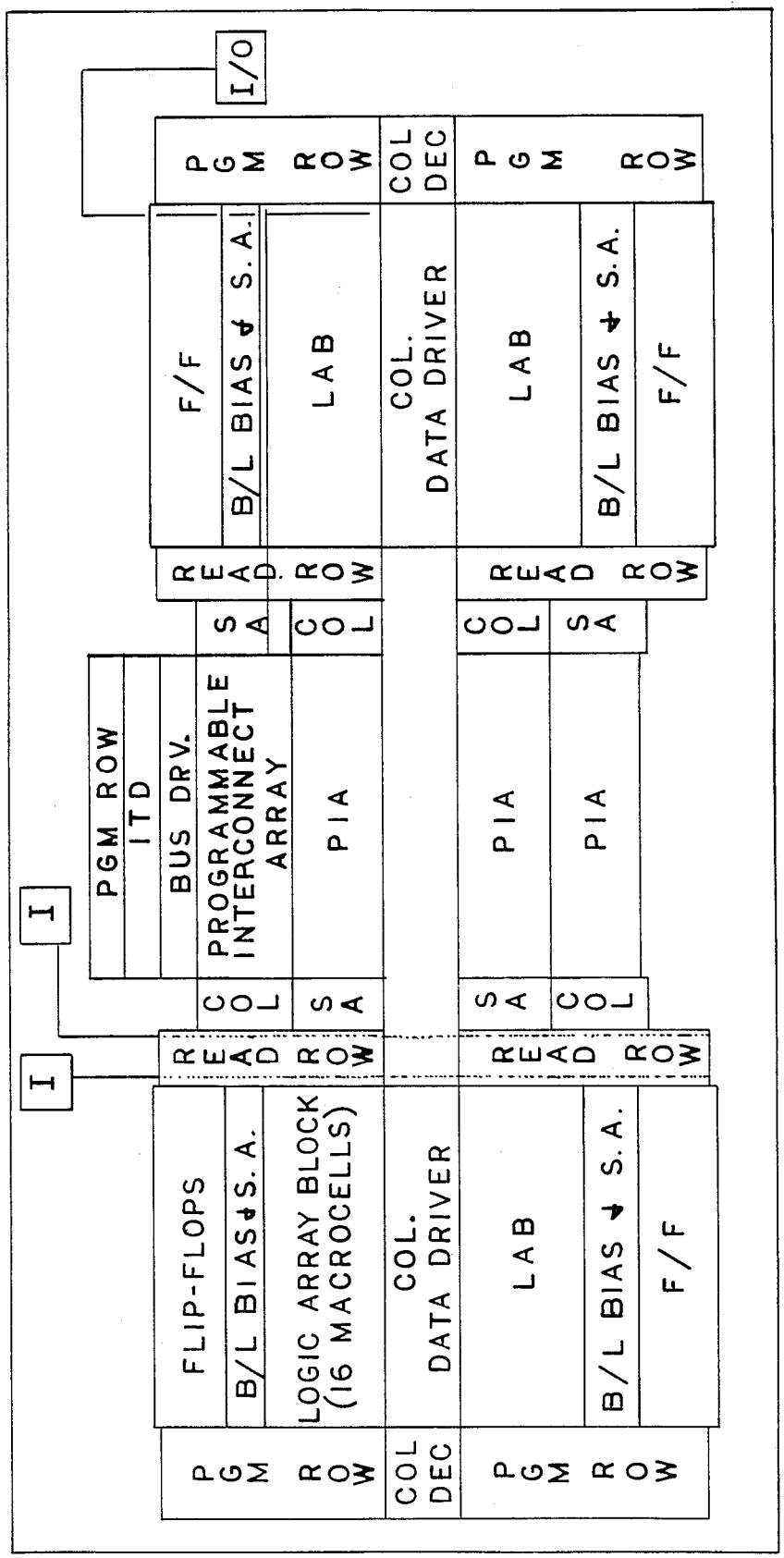
FIG. 7 is a block diagram of an alternative embodiment having fewer LABs than the device shown in FIG. 3.

In the preferred embodiment shown in FIG. 3, each LAB 50 has 16 macrocells, 32 expanders, eight fast inputs, and 24 array inputs from the interconnect terms of the PIA. Each LAB also has a number of tri-state output drivers 53: eight drivers 53 in the case of the LABs labelled group A, B, H, and G, and five drivers 53 in the case of the LABs labelled group C, D, F, and E. While we believe these choices to be optimum for the particular embodiment shown, other choices could be made without departing from the scope and spirit of the invention. For example, in another embodiment (shown in FIG. 7), there are four LABs, each of which has seven tri-state drivers. In addition, the chip shown in FIG. 7 has eight dedicated inputs and four power/ground pins.

PIA blocks 60 will now be described with reference to FIG. 3. The PIA provides a mechanism for programmably routing signals from I/O input pins 40 to any LAB and from any LAB macrocell output to any other LAB. The PIA includes word lines 43 and 62 and bit lines 61. The bit lines are also labelled "interconnect terms" in FIG. 3. In the preferred embodiment shown, there are 52 word lines 43 which come from the I/O lines, and there are 128 word lines 62 which are driven from macrocell buffers 54. Interconnect terms 61 are perpendicular to the word lines. At the intersections of the word lines and bit lines are programmable elements 63 which, when programmed in one state, provide a connection between the associated word and bit lines, and which, when programmed in the other state, provide no such connection. In the preferred embodiment, the programmable elements are EPROM transistors. However, other types of programmable elements such as EEPROM transistors, fuses, anti-fuses, or other similar elements could be used without departing from the scope and spirit of the invention. There are 24 interconnect terms 61 feeding each LAB 50 in the embodiment shown. Again, this number is an estimate as to the optimum number for the device shown in FIG. 3, but a larger or smaller number could be used if desired. The entire PIA (i.e., all of PIA blocks 60 taken together) is therefore a programmable array with 180 word lines and 192 bit lines (eight groups of 24 bit lines).

Figure 4:
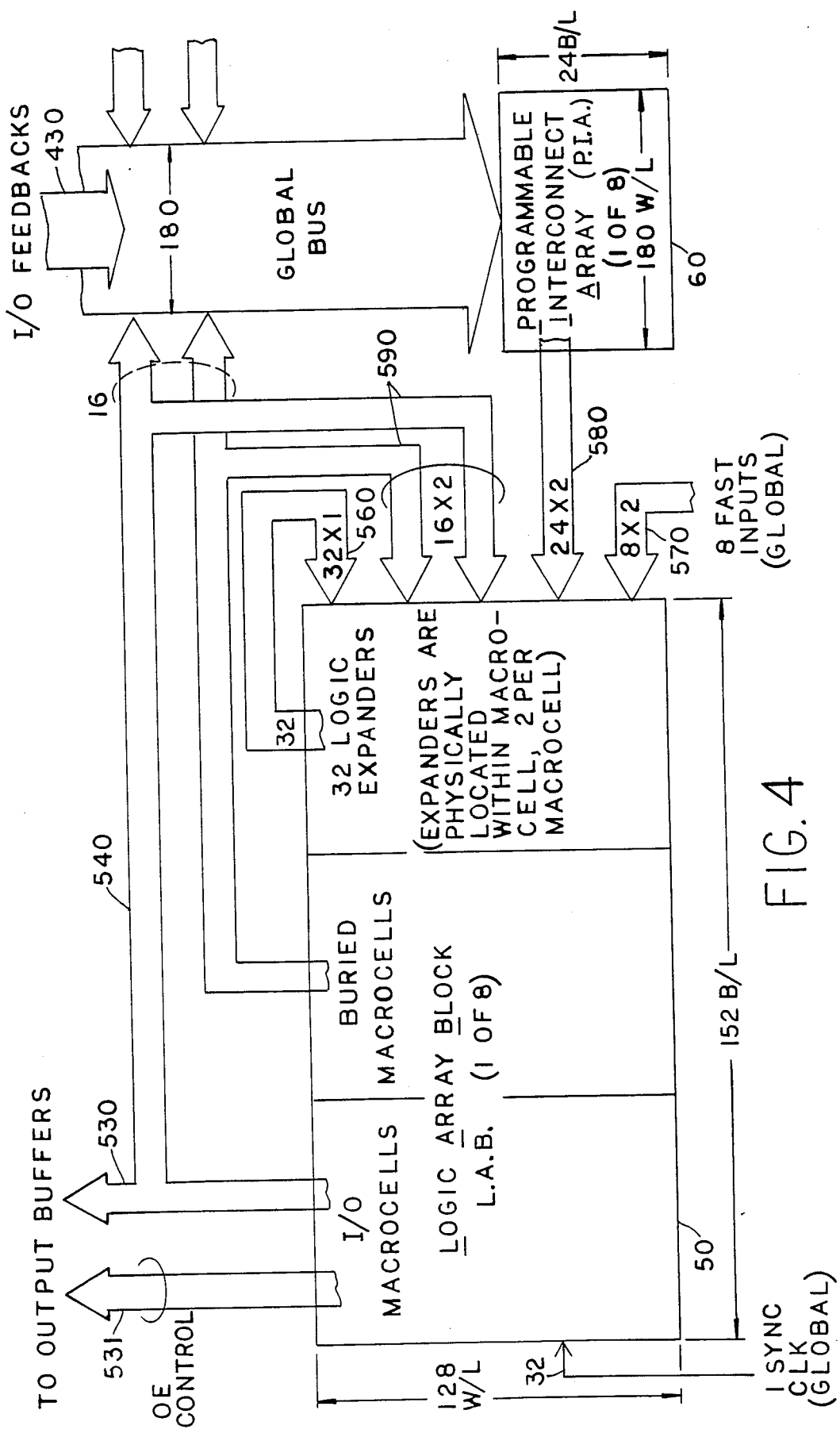
FIG. 4 is a block diagram of one section of the embodiment of FIG. 3 showing one logic array block (LAB) and one programmable interconnect array block (PIA).

FIG. 4 is a block diagram showing a singe LAB 50 and its associated PIA 60. This diagram shows, in concept, the signal routing to and from the LAB and the PIA. Lines going into the LAB are the fast inputs 570 shown as a group of 8×2=16 lines (true and complement signals), the interconnect terms 580 shown as a group of 24×2=48 lines (true and complement signals), the macrocell feedback lines 590 shown as two groups totaling 16×2=32 lines (true and complement signals), and the "expander" feedback lines 560 shown as a group of 32 lines (single polarity only). This totals to 128 word lines for each LAB in the embodiment shown. There are 152 bit lines (P-terms) in each LAB. These will be described in detail in the discussion of FIG. 5. Shown in the diagram of FIG. 4 are the groups of signals 530 and 531 going to the output buffers labeled 53 in FIG. 3. Lines 530 provide the path for data from the macrocells to the output buffers, and lines 531 provide the path for the output enable (OE) signals from the OE P-terms. The PIA block 60 associated with this LAB is shown as having 180 word lines and 24 bit lines as previously described.

Referring now to FIG. 5, we can see more of the detail of one of the macrocells. In this case it is shown with an I/O buffer 53. If it were a buried macrocell, the only difference (at least pictorially) would be the absence of output buffer 53, the OE P-term structure (101, 103, 110), and I/O pin 40. The programmable array is shown as the intersection of word lines 102 and bit lines 101. The label 51 refers to that part labelled "macrocell" in FIG. 3, and the label 52 refers to that part labelled "expander" in FIG. 3. Actually, in the physical layout of the chip, two expander P-terms are preferably grouped with the P-terms of each macrocell for convenience. In the description of FIG. 5, the word "macrocell" will be used to describe the entire collection of P-terms (including the two expander P-terms) and the associated logic gates 103–107, flip-flop 123, and output buffer 53, if present.

There are ten P-terms 101 in this macrocell. Each P-term receives inputs from the 128 word lines 102 (described earlier). There is a programmable element (similar to element 63 in the PIA) at the intersection of each bit line with each word line. A logical AND function of any of the word line variables can be formed by programming; these elements. This is described in U.S. Pat. No. 4,617,479 and will not be repeated here. The correct logical outcome produced by each P-term is represented either as an active-low AND gate 103 or as a NOR gate 104. Those skilled in the art will recognize that other representations could be shown without departing from the scope and spirit of the invention. For example, an active-high AND gate could be used if one notes that the opposite polarity word line were used as its input and thus achieve the same logical result.

Figure 8A:
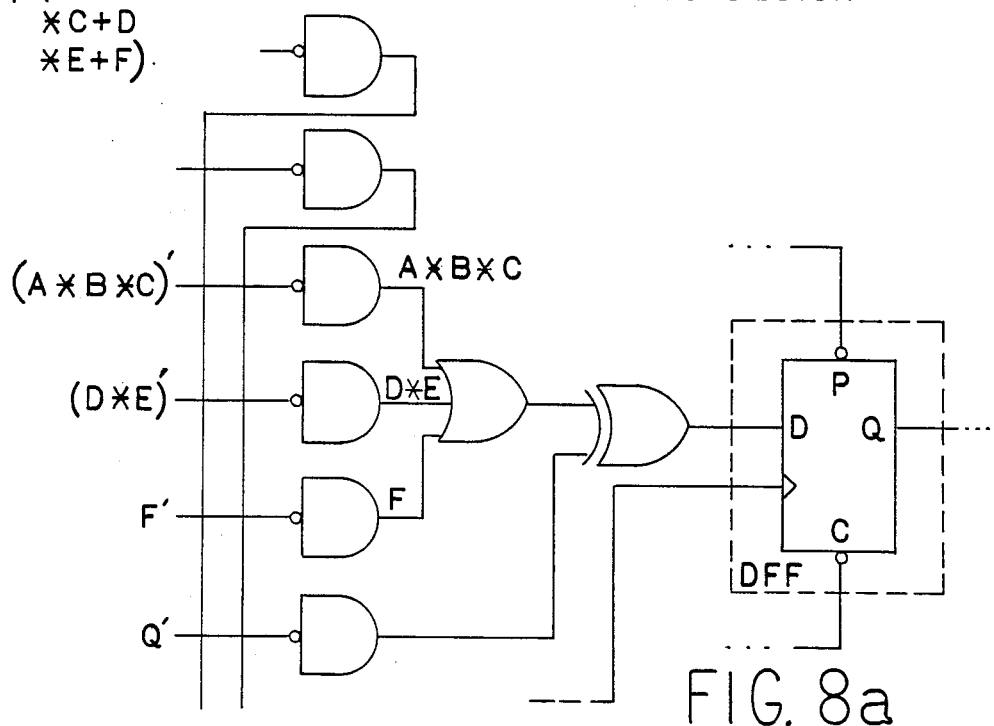
Figure 8B:
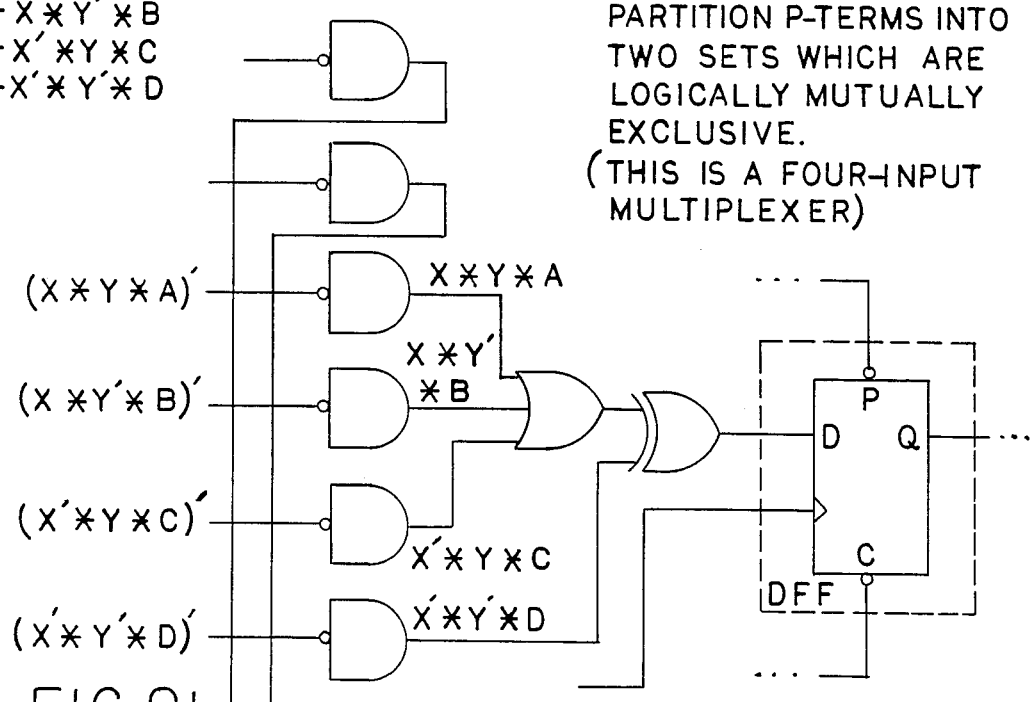
Figure 8C:
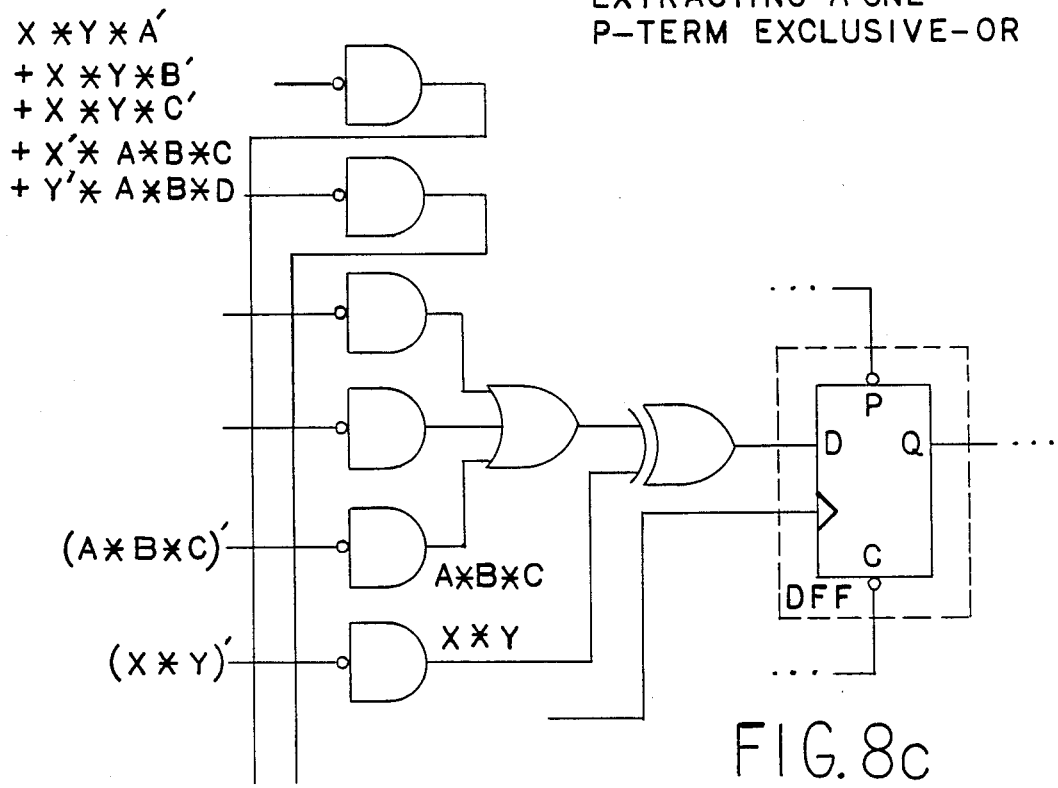
Figure 8D:
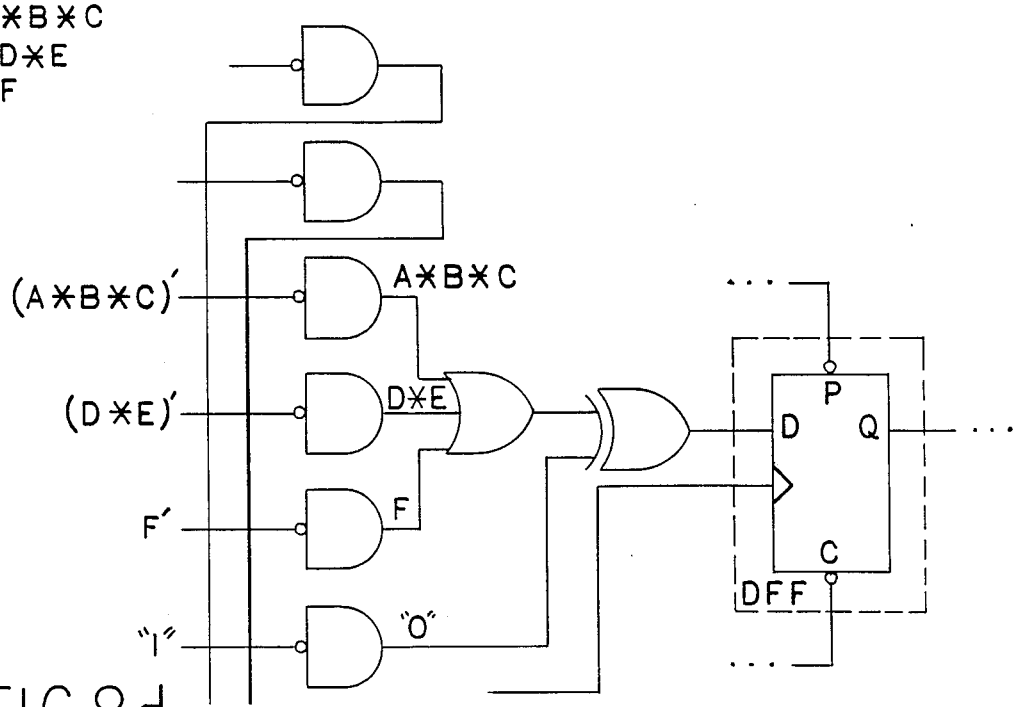

The purpose of each P-term is as follows: The P-term labelled OE is used as the output enable for the associated output buffer 53. If this were a buried macrocell, this bit line would be absent. SETN is used to control the preset of flip-flop 123. The next three terms, P0, P1, and P2, feed OR gate 105 which produces alogical sum-of-products at its output 115. This collection of P-terms, in conjunction with gate 105, forms the "programmable AND, fixed OR" function described in U.S. Pat. No. 4,124,899. The term labeled INV is used as an "invert control" for XOR gate 107. This allows for the creation of inverted sum-of-product functions at line 121. This will be recognized by those skilled in the art as expanding the number of possible functions which can be realized. In addition to acting as a static control for the inverted sum-of-products option, the INV term can be used "dynamically" as a direct input to the XOR gate 107. For example, any logic function which can be reduced to (1) an EXCLUSIVE-OR of an AND function with an AND-OR function, (2) an EXCLUSIVE-OR of an OR function with an OR-AND function, (3) an EXCLUSIVE-OR of an OR function with an AND-OR function, or (4) and EXCLUSIVE-OR of an AND function with an OR-AND function can be implemented directly in one pass through the array. (This is shown in detail in FIGS. 8a and 8c; the dollar sign in FIG. 8a represents the EXCLUSIVE-OR function.) ACLK is used to create an "asynchronous" clock signal for flip-flop 123 in conjunction with gate 106 and gates 109 and 108. CLEARN is used to control the "Clear" line on flip-flop 123. EXP1 and EXP2 are the "expander" P-terms. Note that each expander 52 preferably includes only a single P-term.

Our assignee has studied the most often used logic functions in relation to a variety of possible architectures. In particular, the AND-OR-XOR structure of P0, P1, P2, OR gate 105, and XOR gate 107 was analyzed assuming both less than three AND P-terms (e.g., two AND P-terms) feeding OR gate 105, and more than three AND P-terms (up to eight P-terms such as is used in the prior art macrocell of FIG. 2) feeding the OR gate. The classes of functions included the following: adders, comparators, counters, decoders, demultiplexers, parity generators, and shift registers. The purpose of the study was to evaluate the architecture of the present invention relative to the prior art architecture of FIG. 2. The present new architecture is a combination of three programmable ANDs, a fixed OR, and an XOR, with single-P-term "expanders". This architecture is believed to be superior to both the prior art structure shown in FIG. 2 and to the single-P-term architectures proposed in the above-mentioned Goetting et al. reference. The study bore this out and reached several other important conclusions. It was found that having less than three P-terms feeding the OR gate is very restrictive when doing counters and shift registers. For all other functions examined, three P-terms feeding the OR gate was always as good as four P-terms feeding the OR. (This is only true assuming that in either case there is the additional BLIV P-term and XOR gate 107.) The prior art eight-P-term architecture is only superior for a very limited group of functions (for example, multiplexers with more than four inputs). The study also demonstrated that having approximately two expander P-terms per macrocell was more than sufficient to accommodate the less common functions which require many P-terms.

Figure 8E:
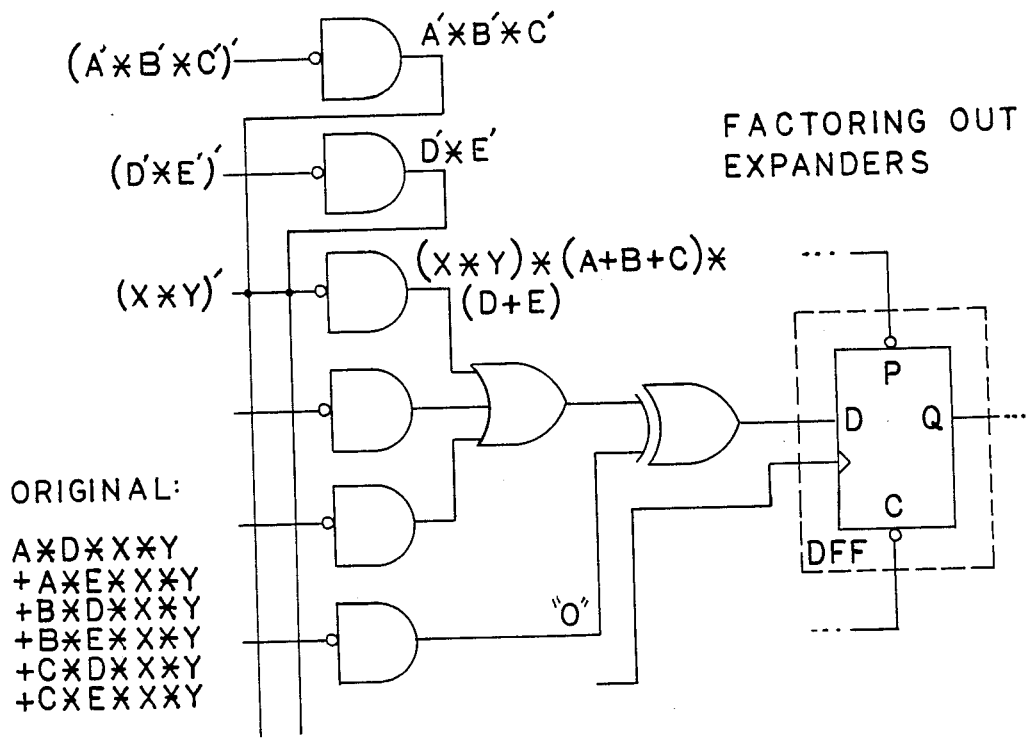
Figure 8F:
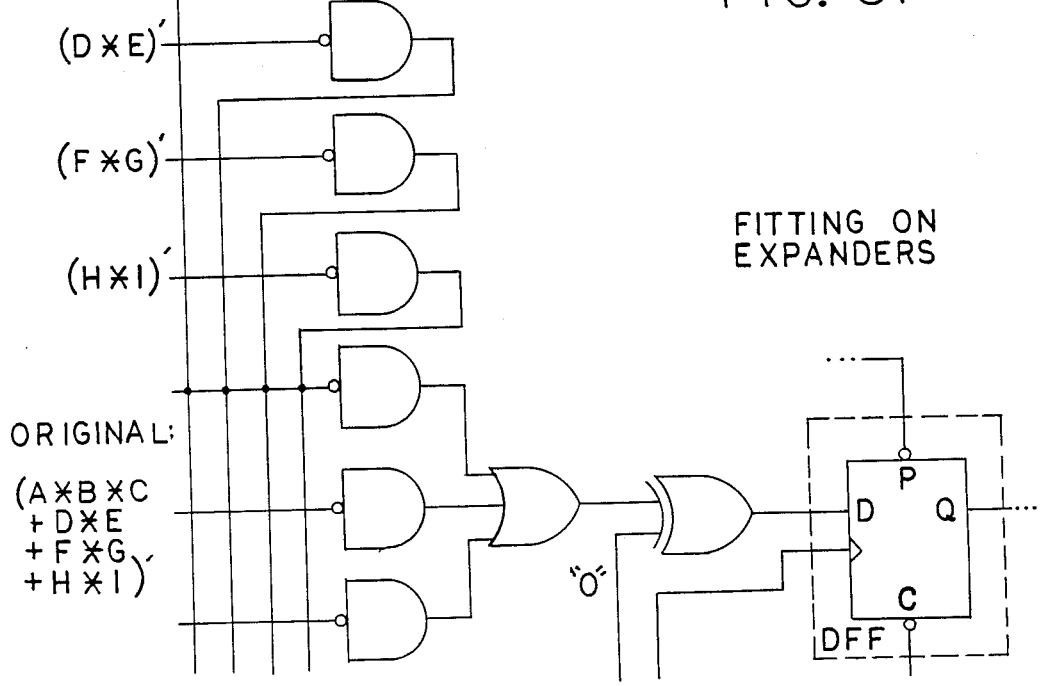

Expanders 52 play an important role in this new architecture. As their name implies, these P-terms allow for growth. That is, they allow for implementation of those (less common) functions which do not fit within the three-P-term limit (for example, an 8-to-1 multiplexer can be fit into 9 expanders). Expander P-terms anywhere in the LAB can be used to form elements of these more complex functions, and then the outputs of these P-terms are combined using another P-term (typically one of the P-terms feeding a fixed OR gate 105) (see, for example, FIG. 8f). Functions formed with expander p-terms can also be used to feed other expanders on single p-terms such as INV, ACLK, SETN, CLEARN, or OE. Also, there are often common P-terms which can be used by a number of logic functions. These common P-terms can be formed by the expanders and then fed to those functions (which are likely to be implemented in a programmable AND, fixed OR section) for which they are required. FIG. 8e shows an example of a logic expression which requires more than three P-terms which can be factored into expressions which can be formed using the expander P-terms and recombined using another P-term (typically this will be a P-term which feeds the fixed OR gate). In FIG. 8e, the original expression has been factored such that two factors are implemented in two expanders and then combined with the remainder of the expression in one of the P-terms feeding the fixed OR rate. The original expression was:

FUNCTION=A*D*X*Y+A*E*X*Y+B*D*X*Y+B*E*X*Y+C*D*X*Y+C*E*X*Y

This expression can be factored and rewritten as:

FUNCTION=(X*Y)*(A+B+C)*(D+E)

The common factors X*Y are formed on the P-term feeding he fixed OR gate, while the remaining factors (A+B+C) and (D+E) are formed on each of two expanders and fed to the P-term which contains the X*Y term. In this example, an expression which would have required six P-terms to implement can now be done in three P-terms. Suppose further that either the expression (A+B+C) or the expression (D+E) were required by some other macrocell or macrocells. These same expressions formed on the expander P-terms could be used again by those other macrocells. Thus an expression generated on the expanders can be amortized across all of the macrocells which have the expander's outputs as word line inputs. This again results in an overall saving of valuable P-term resources. Examples of various types of logic functions which can be fit into the P-term structure of the present invention are shown in FIGS. 8a through 8g. Latches require only two expanders. This structure is shown in FIG. 8h.

Continuing now with FIG. 5, XOR gate 107 receives its inputs from OR gate 105 and P-term INV. Those skilled in the art will recognize that if the logic signal on line 116 is 0, then the output of XOR gate 107 (line 121) will have the same logic value as input 115. On the other hand if line 116 is 1, then 121 will be the logical inversion of 115. In addition to allowing for inverted sum-of-product functions, or positive or inverted product-of-sum functions, this structure, in conjunction with a D flip-flop such as 123, also allows for emulating other flip-flop types such as T, J-K, and R-S. Emulation of various flip-flop types using array logic and XOR gates is the subject of U.S. Pat. No. 4,677,318. When using the expander P-terms as an AND array and the P-terms feeding the OR gate 105 as an OR array, the INV signal 116 needs to be set to a logic 1.

Figure 1:
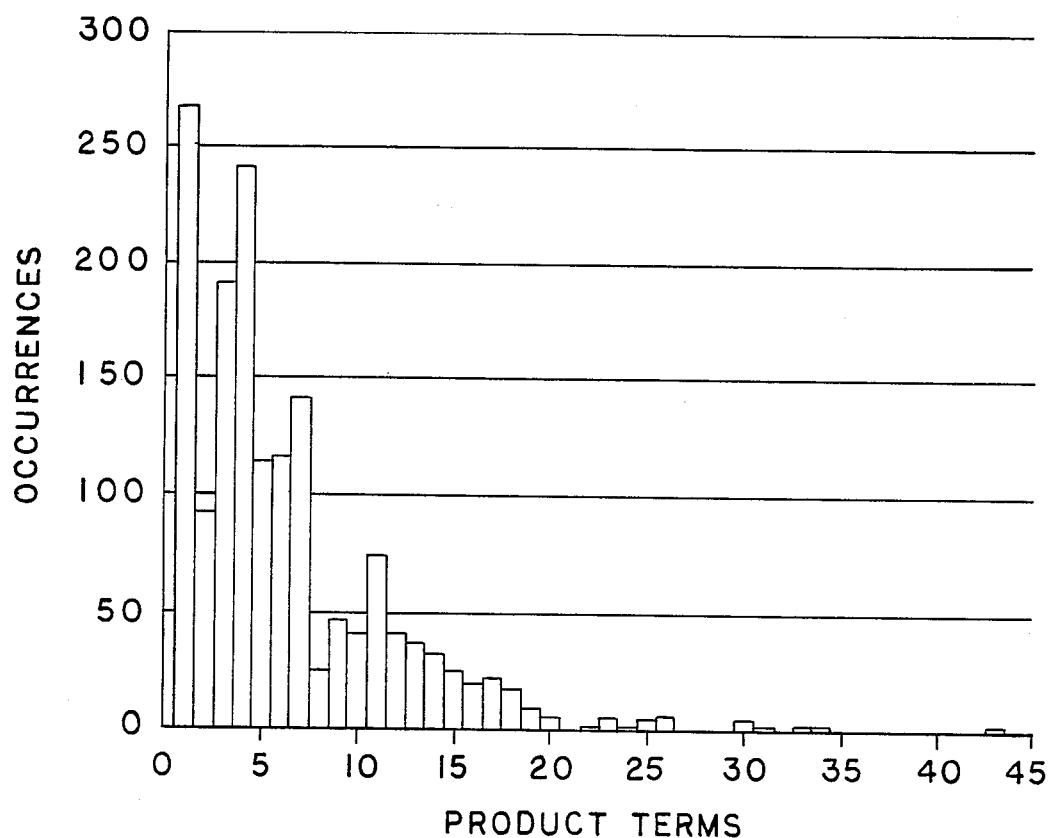
FIG. 1 is a chart showing typical product term distribution (frequency of occurrence of logic functions requiring a given number of product terms to implement the same) for a large sample of PLD designs.
Figures 2, 9:
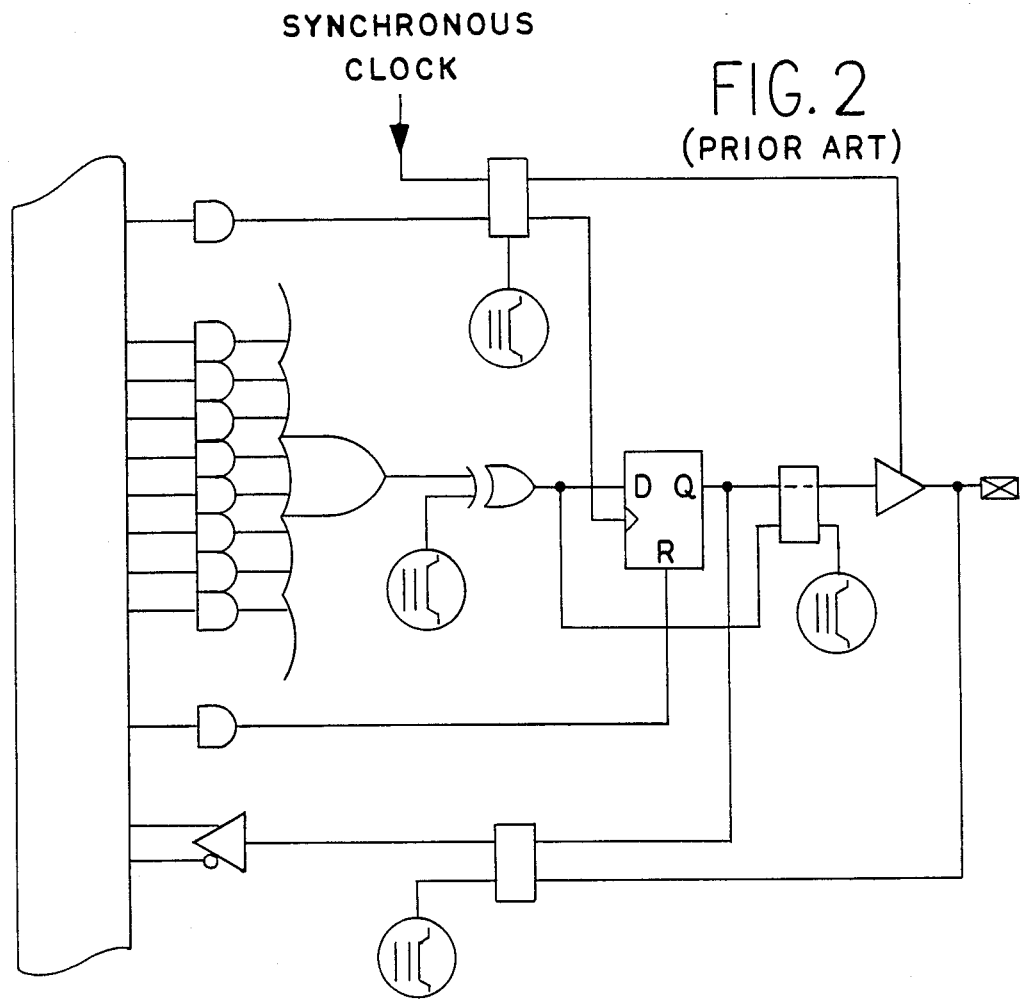
FIG. 2 is a prior art programmable logic circuit macrocell.
FIG. 9 is a truth table useful in explaining the operation of a new flip-flop-type element used in the device of this invention.

Flip-flop block 123 appears to be a simple D flip-flop with active low preset (P) and clear (C). However, this is done for simplicity of illustration of the macrocell. FIG. 9 is a truth table which explains the full functionality of element 123. Note that if P=C=1, then 123 is an edge-triggered flip-flop. At the rising edge of CLK (line 122 in FIG. 5), whatever data is present at the D input 121 is transferred to the Q output 124. If P is 0 and C is 1, then the Q output will be forced to 1 independent of the state of CLK or D. If C is 0 and P is 1, then the Q output will be forced to 0 independent of the state of CLK or D. To those skilled in the art, the case where P=C=0 is an illegal condition and is not defined. For flip-flop 123, however, when P=C=0, the flip-flop is redefined as shown in FIG. 9. It thus becomes a "flow-through latch". Then, whenever line 122 is high, the Q output takes the value of whatever is on the D input. Whenever line 122 is low, the Q output holds the value that was present at the D input when line 122 went low. If line 122 is held high (for example, by programming P-term ACLK high), then signals will propagate directly from 121 to 124. This is the same "combinatorial" function as was provided by multiplexers and architectural control EPROM bits on prior art EPLD circuits. The present new design is simpler, faster, and provides greater functionality. As has been mentioned, a preferred structure for implementing flip-flop 123 is shown in concurrently filed, commonly assigned, co-pending patent application Ser. No. 190,530, which is hereby incorporated by reference herein.

The output signal 124 from flip-flop 123 (1) goes to the input of output driver 53, (2) feeds back (via buffer 54) to a word line driver 57 of its own LAB, and (3) drives one of the word lines of the PIA (indicated as line 62 in FIG. 3) This signal 124 can be used by any other LAB via iLs connection through the PIA. The signal also feeds a conventional tri-state I/O buffer 53 such that if the buffer is enabled by line 110, the signal from 124 will drive off chip through I/O pin 40. I/O pin 40 can also provide an input path from off chip via line 41. This line drives buffer 42 (FIG. 3) whose output becomes one of the word lines for the PIA shown as line 43 in FIG. 3. I/O buffer 53 can be dynamically controlled by the OE P-term, in which case pin 40 may be both an input and an output depending upon the state of line 110. Alternatively, by programming the chip such that OE is always 0, buffer 53 will always be disabled, in which case I/O pin 40 can be used permanently as an input. Thus each of I/O pins 40 can be configured as input, output, or bi-directional input/output terminals. Because of the feedback of signal 124 to the LAB and the PIA, and the I/O input line 41, disabling of the output driver 53 does not result in the loss of the macrocell's functionality. This is a significant advantage over some prior art devices.

Turning now to the clock structure for the LAB, this structure includes inverter 109, AND gate 108, OR gate 106, and P-term ACLK. Three modes of operation are anticipated as follows:

COMBINATORIAL MODE: In this case, P=C=0 as previously described. Further, the ACLK P-term is programmed to always be 1, and line 122 is therefore also always 1. Whatever data is present at line 121 will pass through flip-flop 123 and appear at line 124.

ASYNCHRONOUS MODE: In this case, the line labeled ECKN (which is an extra P-term (not shown) in the LAB) is programmed to be 1. This means that line 125 is logic 0. Then line 122 is directly controlled by the state of the ACLK P-term. ACLK can be any (inputs active-low) AND function of any of the word line variables. Each flip-flop in the LAB has its own separate ("asynchronous") P-term clock.

SYNCHRONOUS MODE: P-term ACLK is programmed to be always 0. Also, ECKN is programmed to be 0 and thus ECK is 1. This allows the signal EXT.(SYNC.) CLK. on line 32 to propagate through AND gate 108 and appear on line 125. EXT.-(SYNC.)CLK. line 32 comes from an input pad (one of the "fast inputs") not shown. This signal on line 125 passes through OR gate 106 and appears on line 122. In this way, an external signal can directly control the clocking of flip-flop 123. Because there is a single ECKN P-term per LAB, the selection of synchronous mode is done on a per LAB basis rather than on a per macrocell basis.

Figure 6A:
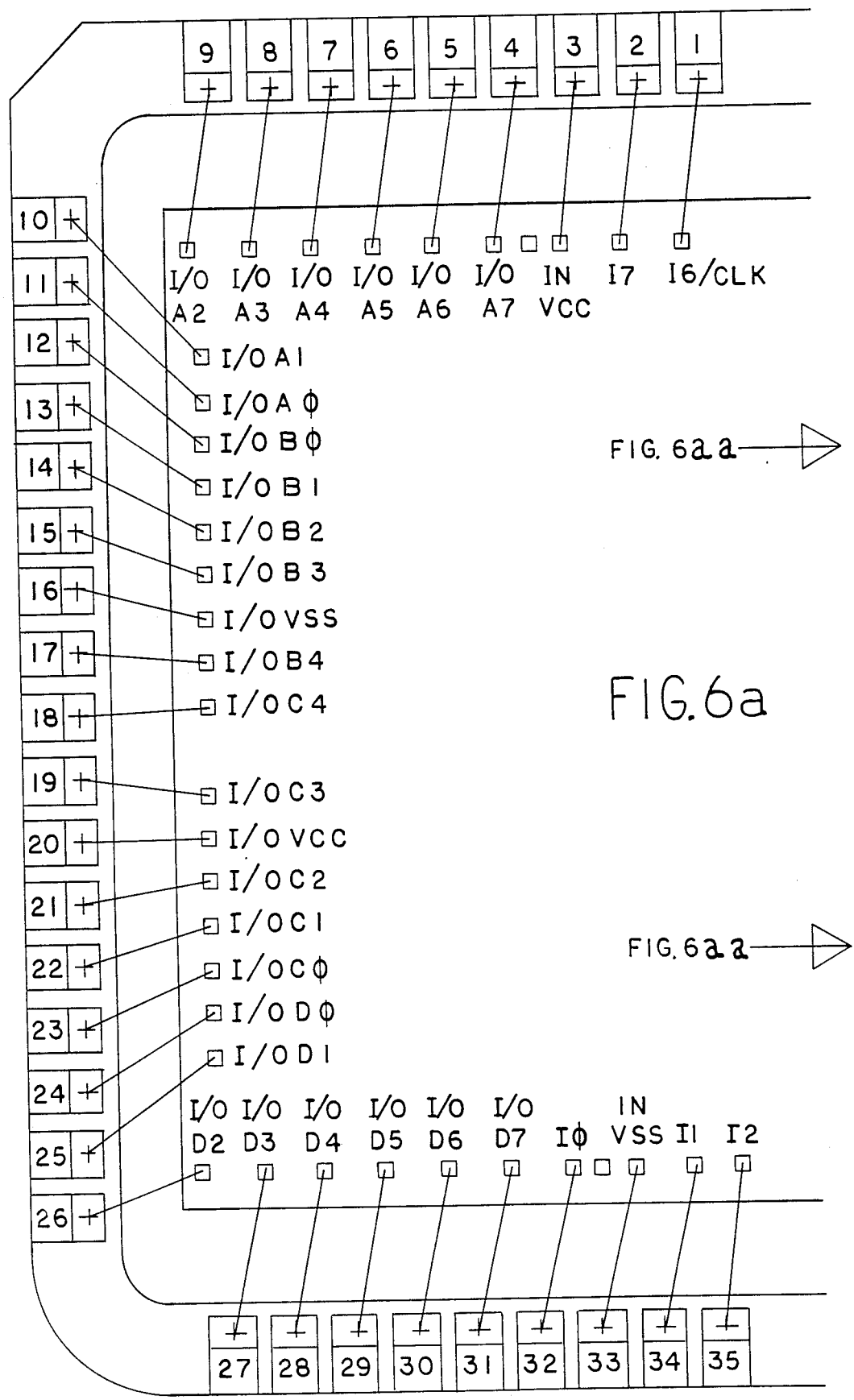
FIGS. 6a (comprising parts 6a and 6aa) and 6b (comprising parts 6b and bb) are diagrams showing two "bond out options" for the device shown in block diagram form in FIG. 3.

Another advantage of the chip architecture of the present invention is that chips of any given configuration can be packaged in any of a variety of ways with no loss of internal resources. For example, FIG. 6a illustrates one way in which the chip of FIG. 3 can be bonded out to 68 pins, while FIG. 6b shows how the same chip can be bonded out to 40 pins. The chip pads which are not bonded out in FIG. 6b are certain I/O pins. However, the "output" signals that could be applied to these chip pads are still usable internally, and the remaining external inputs can be applied to any-LAB via PIA 60. Thus, even though some chip pads are not bonded out in FIG. 6b, the only loss in chip capability is the loss of the external chip I/O connections. (With reference to FIGS. 6a and 6b, the eight LABs on the chip are designated A through H. Thus, for example, in FIG. 6a eight I/O pads 1/OA0-8 of LAB A are bonded out to lead tips 11 through 4, respectively while in FIG. 6b only four I/O pads I/OA0, 1, 2, and 7 are bonded out to lead tips 37 through 34, respectively. In FIG. 6a LABs A, D, E, and H each have eight bonded-out I/O pads and the remaining LABs each have five bonded-out I/O pads. In FIG. 6b LABs A, D, E, and H each have four bonded-out I/O pads and the remaining I/O pads each have three-bonded out I/O pads. In both FIG. 6a and 6b the "fast" inputs are designated I0 through I7.)

Although particular numbers of such components as macrocells, expanders, fast inputs, and array inputs from the PIA are employed in the depicted embodiments described above, it will be understood that (among other possible variations within the scope of the invention that will occur to those skilled in the art) any number of such components can be used without departing from the scope and spirit of the invention.

We claim:

1. A programmable logic device for producing a plurality of first signals, each of which is a programmable logical function of a plurality of second signals, each of which is applied to a respective one of a plurality of word line conductors, said programmable logic device comprising:

a plurality of first P-term line conductors, each of which is programmably interconnectable to each of said word line conductors for producing on each of said first P-term line conductors a third signal which is a logical function of the second signals applied to the word line conductors to which that first P-term line conductor is interconnected;

means for logically combining said third signals to produce a first of said first signals;

at least one second P-term line conductor which is programmably interconnectable to each of said word line conductors for producing on said second P-term line conductor a second of said first signals which is a logical function of the second signals applied to the word line conductors to which said second P-term line conductor is interconnected; and means for applying said second of said first signals to one of said word line conductors as the second signal applied to that word line conductor, wherein said first and second P-term line conductors comprise a macrocell, and wherein said apparatus includes a plurality of said macrocells, said word line conductors being common to all of said macrocells.

2. The apparatus defined in claim 1 wherein the number of macrocells in said apparatus is greater than the number of said first P-term line conductors in any one of said macrocells.

3. The apparatus defined in claim 1 wherein the total number of said second P-term line conductors in said apparatus is greater than the number of first P-term line conductors in any one of said macrocells.

4. The apparatus defined in claim 1 wherein in any one macrocell, the number of said first P-term line conductors is greater than the number of said second P-term line conductors.

5. The apparatus defined in claim 1 wherein each of said first and second P-term line conductors is programmably interconnectable to each of said word line conductors via a programmable element selected from the group consisting of an EPROM transistor and an EEPROM transistor.

6. A programmable logic device comprising:

first and second logic array blocks respectively including (1) separate first and second pluralities of word line conductors; (2) separate first and second pluralities of P-term line conductors, each of said P-term line conductors in said first plurality of P-term line conductors being programmably interconnectable only to each of said word line conductors in said first plurality of word line conductors, and each of said P-term line conductors in said second plurality of P-term line conductors being programmably interconnectable only to each of said word line conductors in said second plurality of word line conductors, for producing on each P-term line conductor a signal which is a logical function of the signals on the word line conductors to which that P-term line conductor is interconnected; and (3) separate first and second means for respectively deriving a first output signal from at least one of said P-term line conductor signals associated with said first plurality of P-term line conductors and a second output signal from at least one of said P-term line conductor signals associated with said second plurality of P-term line conductors; and programmable means for selectively applying said first output signal to at least one of the word line conductors in said second plurality of word line conductors.

7. The apparatus defined in claim 6 further comprising:
means for applying the output signal of said at least one logic array block to at least one of the word line conductors of said at least one logic array block.

8. The apparatus defined in claim 6 wherein at least one of said P-term line conductors signals in at least one of said logic array blocks is applied to at least one of the word line conductors of that logic array block and only that logic array block.

9. The apparatus defined in claim 6 wherein at least one of said P-term line conductor signals in at least one of said logic array blocks is applied only to one of the word line conductors of that logic array block.

10. The apparatus defined in claim 6 further comprising:
means for receiving an input signal applied to the programmable logic device; and
programmable means for selectively applying said input signal to at least one of the word line conductors of at least one of said logic array blocks.

11. The apparatus defined in claim 6 further comprising:
means for receiving an input signal applied to the programmable logic device; and
programmable means for, selectively applying said input signal to at least one of the word line conductors of either or both of said logic array blocks.

12. The apparatus defined in claim 6 wherein each of said P-term line conductors in each of said first and second logic array blocks is programmably interconnectable to each of said wordline conductors in the associated logic array block via a programmable element selected from the group consisting of an EPROM transistor and an EEPROM transistor.

13. The apparatus defined in claim 6 wherein said programmable means comprises a programmable element selected from the group consisting of an EPROM transistor and an EEPROM transistor.

14. The apparatus defined in claim 10 wherein said programmable means for selectively applying said input signal to at least one of the word line conductors of at least one of said logic array blocks comprises a programmable element selected from the group consisting of an EPROM transistor and an EEPROM transistor.

15. The apparatus defined in claim 11 wherein said programmable means for selectively applying said input signal to at least one of the word line conductors of either or both of said logic array blocks comprises a programmable element selected from the group consisting of an EPROM transistor and an EEPROM transistor.

* * * * *